(12) United States Patent
Ohtani (10) Patent No.: US 6,551,907 B2
(45) Date of Patent: *Apr. 22, 2003

(54) METAL-GETTERING METHOD USED IN THE MANUFACTURE OF CRYSTALLINE-SI TFT

(75) Inventor: Hisashi Ohtani, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 13 days.

This patent is subject to a terminal disclaimer.

(21) Appl. No.: 09/824,688

(22) Filed: Apr. 4, 2001

(65) Prior Publication Data

US 2001/0019878 A1 Sep. 6, 2001

Related U.S. Application Data

(62) Division of application No. 09/119,778, filed on Jul. 21, 1998, now Pat. No. 6,232,205.

(30) Foreign Application Priority Data

Jul. 22, 1997 (JP) .............................................. 9-212464

(51) Int. Cl.[7] .............................................. H01L 21/322
(52) U.S. Cl. ........................ 438/476; 438/143; 438/166; 438/486
(58) Field of Search ........................... 257/913; 438/143, 438/166, 471, 476, 486, FOR 144, FOR 146

(56) References Cited

U.S. PATENT DOCUMENTS

| 3,811,975 A | 5/1974 | Van Lierop et al. |
| 4,692,345 A | 9/1987 | Nishiura et al. |
| 5,098,852 A | 3/1992 | Niki et al. |
| 5,162,241 A | 11/1992 | Mori et al. |
| 5,194,395 A | 3/1993 | Wada |
| 5,403,772 A | 4/1995 | Zhang et al. |
| 5,426,064 A | 6/1995 | Zhang et al. |
| 5,436,498 A | 7/1995 | Lesk |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,563,426 A | 10/1996 | Zhang et al. |
| 5,569,610 A | 10/1996 | Zhang et al. |

(List continued on next page.)

FOREIGN PATENT DOCUMENTS

| JP | 06-333825 | 12/1994 |
| JP | 09-260288 | 10/1997 |
| JP | 10-301146 | 11/1998 |
| JP | 11-097352 | 4/1999 |

*Primary Examiner*—Wael Fahmy
*Assistant Examiner*—Marcos D. Pizarro-Crespo
(74) *Attorney, Agent, or Firm*—Eric J. Robinson; Robinson Intellectual Property Law Office, P.C.

(57) ABSTRACT

Disclosed is a simplified technique of introducing a metal element capable of promoting the crystallization of silicon into an amorphous silicon film to be crystallized, and of removing the metal element from the film. An amorphous silicon film 102 is formed on a substrate, a mask 103 is formed thereon, and a nickel-containing PSG film is further formed thereover. This is heated at 560° C. to thereby make nickel diffused in the direction 106, and the film is crystallized. Next, this is further heated at 850° C. to thereby make phosphorus diffused into the region 107, in which nickel is gettered by the thus-diffused phosphorus. Thus, the crystallization of silicon is promoted by the metal element nickel, and the nickel is then removed from the crystallized silicon film.

40 Claims, 4 Drawing Sheets

U.S. PATENT DOCUMENTS

| | | |
|---|---|---|
| 5,569,936 A | 10/1996 | Zhang et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,629,215 A * | 5/1997 | Goronkin .................... 438/492 |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kasumoto et al. |
| 5,663,077 A | 9/1997 | Adachi et al. |
| 5,677,549 A | 10/1997 | Takayama et al. |
| 5,696,386 A | 12/1997 | Yamazaki |
| 5,696,388 A | 12/1997 | Funada et al. |
| 5,698,891 A | 12/1997 | Tomita et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,744,824 A | 4/1998 | Kousai et al. |
| 5,757,063 A | 5/1998 | Tomita et al. |
| 5,773,356 A | 6/1998 | Gonzalez et al. |
| 5,821,138 A | 10/1998 | Yamazaki et al. |
| 5,834,363 A | 11/1998 | Masanori |
| 5,864,151 A | 1/1999 | Yamazaki et al. |
| 5,869,363 A | 2/1999 | Yamazaki et al. |
| 5,888,857 A | 3/1999 | Zhang et al. |
| 5,888,858 A | 3/1999 | Yamazaki et al. |
| 5,904,770 A | 5/1999 | Ohtani et al. |
| 5,932,893 A | 8/1999 | Miyanaga et al. |
| 5,961,743 A | 10/1999 | Yamazaki et al. |
| 5,985,740 A | 11/1999 | Yamazaki et al. |
| 6,048,758 A | 4/2000 | Yamazaki et al. |
| 6,087,245 A | 7/2000 | Yamazaki et al. |
| 6,118,151 A * | 9/2000 | Tsutsu ........................ 257/347 |
| 6,165,824 A | 12/2000 | Takano et al. |
| 6,232,205 B1 * | 5/2001 | Ohtani ....................... 438/476 |

* cited by examiner

METAL-GETTERING METHOD USED IN THE MANUFACTURE OF CRYSTALLINE-SI TFT

This is a divisional of application Ser. No. 09/119,778, filed on Jul. 21, 1998, now U.S. Pat. No. 6,232,205.

FIELD OF THE INVENTION

The present invention relates to a method for producing thin film transistors (hereinafter referred to as TFT) that comprise a crystalline silicon film.

BACKGROUND OF THE INVENTION

Known are TFT comprising an amorphous silicon film. Such conventional TFT are used essentially for constructing active-matrix circuits to be in active-matrix type, liquid crystal display devices.

However, amorphous silicon TFT are problematic in that their acting speed is low and that they could not be used in practicable P-channel devices.

Because of such their problems, amorphous silicon TFT are used almost nowhere except for active-matrix circuits.

As one means capable of solving the problems, known is a structure comprising a crystalline silicon film.

To obtain such a crystalline silicon film, a heating method is known at present, in which, however, films of good quality could not be obtained.

The present applicant has already developed a technique of obtaining a crystalline silicon film under heat, in which the crystallization of silicon under heat is promoted by a predetermined metal element.

Concretely, the method developed by the applicant comprises introducing a metal element such as typically nickel into an amorphous silicon film followed by heating the film to thereby convert it into a crystalline silicon film.

The crystallinity of the crystalline silicon film as obtained in that method is higher than that of the others as obtained by heating only.

However, in the method, the nickel element used remains in the crystalline silicon film formed, thereby having some negative influences on the characteristics of TFT comprising the film.

Concretely, one problem with TFT comprising the film is that the characteristics of TFT vary with the lapse of time to lower the reliability thereof.

Another problem is that the method requires the nickel addition and therefore the steps constituting the method are complicated.

SUMMARY OF THE INVENTION

The invention disclosed herein is to provide a technique of improving TFT having a crystalline silicon film to be formed by the use of a metal element capable of promoting the crystallization of silicon, and is characterized in that the metal element used is prevented from having some negative influences on the characteristics of the TFT. The invention is further characterized in that the steps constituting the method of the invention are simplified as much as possible.

One aspect of the invention disclosed herein is a method for producing a semiconductor device, which comprises diffusing a metal element capable of promoting the crystallization of silicon, from a partial region of an amorphous silicon film into the film, followed by making the metal element gettered by a gettering element, and is characterized in that;

The metal element and the gettering element are introduced into the silicon film from a material as provided to be in contact with said partial region of the film.

Most preferably, the metal element capable of promoting the crystallization of silicon is Ni, and the gettering element is phosphorus. This combination produces the best results of crystallization of silicon with Ni and removal of Ni with phosphorus.

In general, as the element capable of promoting the crystallization of silicon, employable are one or more kinds of elements selected from Fe, Co, Ni, Ru, Rh, Pd, Os, Ir, Pt, Cu, Au, Ge, Pd and In.

As the gettering element, usable is arsenic or antimony except phosphorus. The gettering element referred to herein is one that getters the metal element having been used herein for promoting the crystallization of silicon.

Preferably, the metal element is introduced into the silicon film under heat at a temperature falling between 500° C., and 750° C., and the gettering element is introduced thereinto under heat at a temperature falling between 800° C. and 1100° C.

This heating mode is based on the fact that the metal element is diffused under heat within such a temperature range falling between 500° C. and 750° C. to promote the crystallization of silicon, while the gettering element is diffused little within the temperature range. Specifically, in the method of the invention, the amorphous silicon film is selectively crystallized under heat at a temperature falling between 500° C. and 750° C., and thereafter it is further heated at a temperature falling between 800° C. and 1100° C., at which the gettering element can diffuse, whereby the gettering element is diffused into the film to getter the metal element.

In this method of the invention, the source of the metal element for promoting the crystallization of silicon and the source of the gettering element may be in one and the same material, whereby the method is simplified.

In place of the amorphous silicon film, employable is an amorphous film consisting essentially of silicon. For example, employable is an amorphous, compound semiconductor film, of which 50% or more is silicon.

Another aspect of the invention is a method for producing a semiconductor device, which comprises;

a step of keeping a material that contains phosphorus and a metal element capable of promoting the crystallization of silicon, in contact with a partial region of an amorphous silicon film, a step of first heat treatment for diffusing the metal element from said partial region into the amorphous silicon film to thereby attain crystal growth in the film, and a step of second heat treatment for diffusing phosphorus from said partial region into the amorphous silicon film to thereby make the metal element gettered by the thus-diffused phosphorus, wherein;

the diffusion distance for the metal element is longer than that for phosphorus.

Still another aspect of the invention is a method for producing a semiconductor device, which comprises;

a step of keeping a material that contains phosphorus and a metal element capable of promoting the crystallization of silicon, in contact with a partial region of an amorphous silicon film, a step of first heat treatment for diffusing the metal element from said partial region into the amorphous silicon film to thereby attain crystal growth in the film, and a step of second heat treatment for diffusing phosphorus from said partial region into the amorphous silicon film to thereby make the metal element gettered by the thus-diffused phosphorus, wherein;

the temperature for the first heat treatment falls between 500° C. and 750° C., and the temperature for the second heat treatment falls between 800° C. and 1100° C.

Still another aspect of the invention is a method for producing a semiconductor device, which comprises;

a step of keeping a material that contains phosphorus and a metal element capable of promoting the crystallization of silicon, in contact with a partial region of an amorphous silicon film, a step of first heat treatment for diffusing the metal element from said partial region into the amorphous silicon film to thereby attain crystal growth in the film, a step of second heat treatment for diffusing phosphorus from said partial region into the amorphous silicon film to thereby make the metal element gettered by the thus-diffused phosphorus, and a step of removing the region into which phosphorus has diffused, wherein;

the temperature for the first heat treatment falls between 500° C. and 750° C., the temperature for the second heat treatment falls between 800° C. and 1100° C., and the diffusion distance for the metal element is longer than that for phosphorus.

DESCRIPTION OF PREFERRED EMBODIMENTS OF THE INVENTION

Preferred embodiments of the invention are described below, with reference to the drawings attached hereto.

Figure 1A:
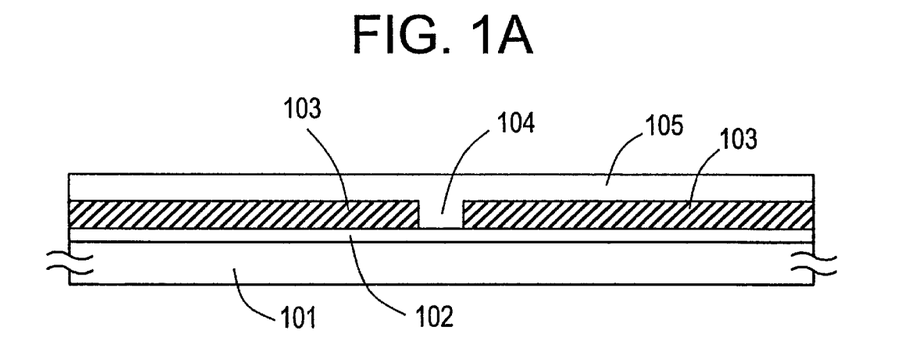
FIG. 1A to FIG. 1D, and FIG. 2A to FIG. 2E show a process for forming the TFT.

First referred to are FIG. 1A to FIG. 1D. A film 105 containing phosphorus and nickel is formed to be partially in contact with the amorphous silicon film 102. In this embodiment, the film 105 is a nickel-containing PSG film. (FIG. 1A)

Figure 1B:
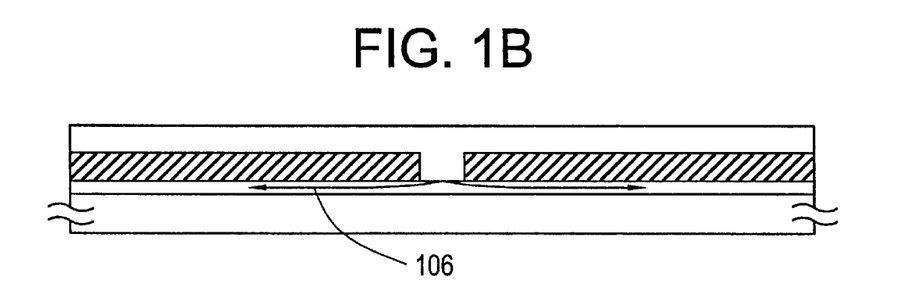

Next, this is heated at 560° C. for 12 hours, whereby nickel is diffused into the amorphous silicon film 102 through the opening 104, in the manner as indicated by 106. In this step, the film 102 is crystallized. The crystallization is promoted in the direction as indicated by 106. (FIG. 1B)

Figure 1C:
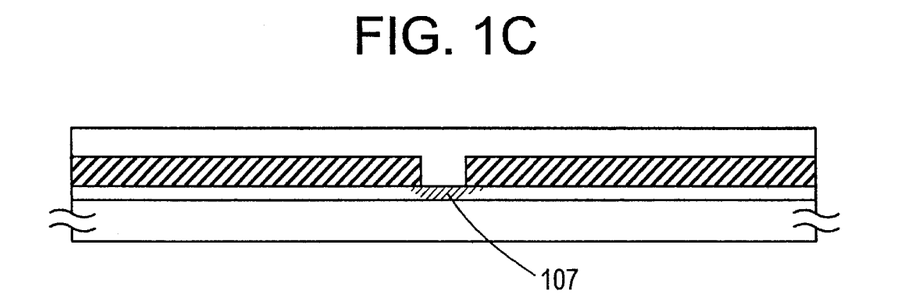

Next, this is further heated at 850° C. for 2 hours. In this step, phosphorus is diffused into the region 107. (FIG. 1C)

Figure 1D:
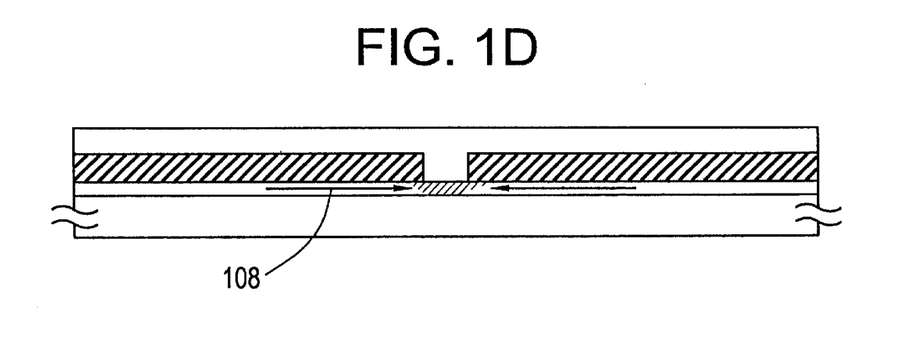

In this step, nickel is gettered by phosphorus having diffused into the region 107. (FIG. 1D)

In this, nickel moves in the direction as indicated by 108, and is fixed in the region 107.

Next, referred to are FIG. 2A to FIG. 2E. Except the nickel-gettered region 107, the silicon film is patterned to form active layers 112 and 113 for TFT, as in FIG. 2A.

Figure 2A:
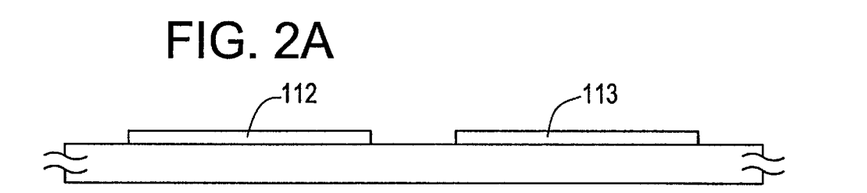

Owing to the action of nickel used herein, the active layers 112 and 113 shall have a high degree of crystallinity. In addition, since the nickel used was gettered, the residual nickel concentration in those layers is low.

As in the above, the present invention is based on the fact that the temperature, at which the metal element for promoting the crystallization of silicon diffuses, differs from the temperature, at which the gettering element for gettering the metal element diffuses, and is characterized by the two-stage heating for the diffusion of the metal element in the first heating step where silicon is crystallized and for the diffusion of the gettering element in the second heating step where the metal element is gettered.

Without requiring any complicated steps, the constitution of the invention gives a crystalline silicon film having a high degree of crystallinity, and the film thus formed in the invention is free from the influences of the metal element used for promoting the crystallization of silicon.

Now, the invention is described in more detail with reference to the following Examples, which, however, are not intended to restrict the scope of the invention.

EXAMPLE 1

Again referred to are FIG. 1A to FIG. 1D and FIG. 2A to FIG. 2E, which show the process of Example 1. First, as in FIG. 1A, an amorphous silicon film 102 is formed on a quartz substrate 101 through thermal low-pressure CVD, the film 102 formed having a thickness of 50 nm.

In this Example, the amorphous silicon film is directly formed on the quartz substrate. Apart from this embodiment, an underlying layer of a silicon oxide film, a silicon nitride film or a silicon oxynitride film may be formed on the quartz substrate prior to forming the amorphous silicon film thereon.

This Example requires a step of diffusing phosphorus, in which, therefore, the substrate must be made of a material resistant to the temperature for the diffusion step (not lower than 800° C.). The substrate may be made of a semiconductor material or the like coated with an insulating film.

After the amorphous silicon film 102 has been formed, a silicon oxide film (not shown) having a thickness of 250 nm is formed thereon through plasma CVD. Then, this silicon oxide film is patterned into a mask 103. (FIG. 1A)

This mask 103 has an opening 104, at which the amorphous silicon film 102 is exposed outside.

The horizontal cross section of this opening 103 is of a rectangular form that extends from the front side of the drawing to the depth thereof.

Next, a nickel-containing PSG film 105 is formed over the mask 103. The PSG film has a thickness of 200 nm.

In this condition, the PSG film 105 is kept in contact with the amorphous silicon film 102 at the part of the opening 104 formed in the mask 103. In other words, in this condition, nickel and phosphorus are kept in contact with a part of the amorphous silicon film 102.

In that manner, obtained is the condition of FIG. 1A. Next, this is heated at 560° C. for 12 hours. In general, nickel diffuses within a temperature range falling between 500° C. and 750° C. or so, but phosphorus diffuses little within the range.

In this step, therefore, phosphorus does not diffuse, but nickel diffuses in the direction as indicated by 106. The nickel diffusion promotes the crystallization of the amorphous silicon film. (FIG. 1B)

Precisely, in this step, crystal growth is attained in the direction parallel to the surface of the film, as so indicated by the arrows 106. The crystal growth reaches 100 μm or longer.

The heat treatment for the crystallization is effected in a heating furnace equipped with a resistance heater. In place of using such a heating furnace, infrared radiations may be applied to the film.

After having been crystallized, the film is again heated. In this step, the film is heated at 850° C. for 2 hours. This heat treatment is also effected in a heating furnace equipped with a resistance heater. In place of using such a heating furnace, infrared radiations may be applied to the film.

As a result of the latter heat treatment, phosphorus is diffused from the PSG film into the silicon film. Thus is formed a region 107 into which phosphorus has diffused.

During the latter heat treatment, nickel having once diffused into the silicon film is again diffused, then bonded to the phosphorus existing in the region 107, and fixed therein.

The phosphorus and the nickel form a variety of bonding forms, and the bonding of the two is very firm. Accordingly, the nickel having diffused in the silicon film during the heat treatment is concentrated in the region having a high concentration of phosphorus, and is fixed therein.

In this Example, nickel is fixed in the region 107 into which phosphorus has diffused. This condition is illustrated in FIG. 1D, in which nickel is concentrated in the region 107 in the manner as indicated by 108.

As in this process, the nickel having remained in the silicon film after the crystallization of the film is fixed (segregated) in a partial region (that is, in the region 107 in this embodiment).

Next, the PSG film 105 is removed, and the silicon film exposed at the opening 104 is removed. Then, the mask 103 of the silicon nitride film is removed.

In that manner, the silicon film is exposed. Next, the silicon film is patterned to give patterns 112 and 113, as in FIG. 2A.

This patterning is effected in the region in which the crystal growth 106 was attained in the step of FIG. 1B. The patterns must be formed except the region 107 where nickel has concentrated.

In FIG. 2A, the pattern 112 is to be the active layer for a P-channel TFT, and the pattern 113 is to be the active layer for an N-channel TFT.

Figure 2B:
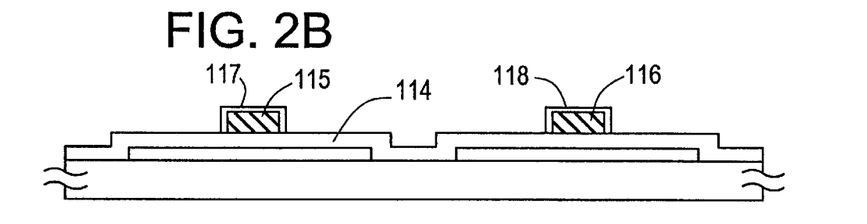

Next, as in FIG. 2B, a gate-insulating layer of a silicon oxide film 114 is formed through plasma CVD to have a thickness of 100 nm.

Further, an aluminum film having a thickness of 400 nm is formed thereon through sputtering. Then, this aluminum film is patterned into patterns 115 and 116. These patterns are to be the gate electrodes of TFT.

After the gate electrode patterns 115 and 116 have been formed, oxide films 117 and 118 are formed around them through anodic oxidation. Thus is obtained the condition of FIG. 2B.

Figure 2C:
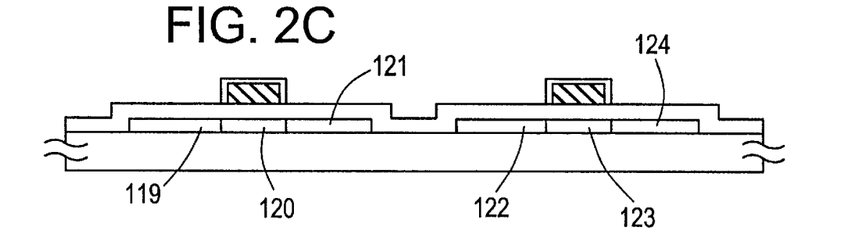

Next, phosphorus is doped according to a plasma doping method. In this step, phosphorus is doped into the regions 119, 121, 122 and 124, but not into the regions 120 and 123. (FIG. 2C)

Figure 2D:
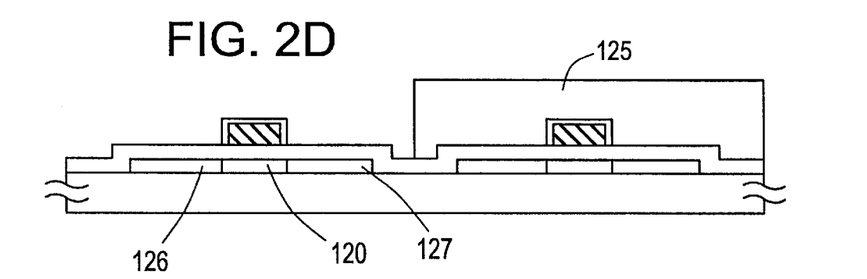

Next, as in FIG. 2D, a resist mask 125 is formed, and boron is then doped.

In this step, the dose of boron to be doped shall be higher by 10 times or so than that of the previously doped phosphorus.

As a result of the boron doping in this step, the conductivity of the regions 119 and 120 having been doped in the previous step to have N-type conductivity, is inverted into P-type one. Thus are formed P-type regions 126 and 127.

Figure 2E:
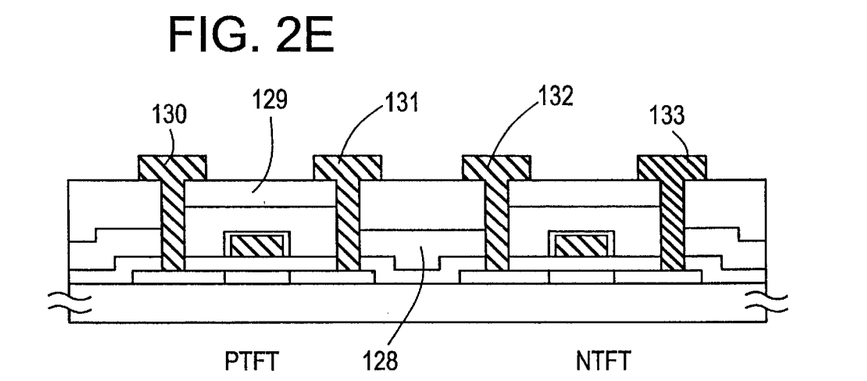

After the doping treatment, the resist mask 125 is removed, and the layered structure is annealed through exposure to laser rays.

Thus are formed the source region 126, the channel region 120 and the drain region 127 for a P-channel TFT (PTFT).

Also formed are the source region 124, the channel region 123 and the drain region 122 for an N-channel TFT (NTFT).

Next, an interlayer insulating film of a silicon nitride film 128 is formed through plasma CVD to have a thickness of 250 nm, and an acrylic resin film 129 is formed through spin coating.

The thickness of the acrylic resin film 129 shall be 700 nm in the thinnest portion.

Next formed are contact holes, in which are formed a source electrode 130 and a drain electrode 131 for the P-channel TFT. Also formed therein are a source electrode 133 and a drain electrode 132 for the N-channel TFT.

As a result of the process noted above, formed is an integrated structure having both a P-channel TFT and an N-channel TFT on one and the same substrate.

In this Example, used is aluminum for the gate electrode. Apart from aluminum, also employable is any of titanium or silicon materials or even various silicide materials to form the gate electrode.

This Example demonstrates the production of a top-gate-type TFT, to which, however, the invention is not limited. The invention is applicable also to the production of a bottom-gate-type TFT in which gate electrodes are below active layers (that is, directly on the substrate).

To produce such a bottom-gate-type TFT, gate electrodes are first formed on the substrate, then an amorphous silicon film is formed thereon, and the film is processed for crystallization according to the method of the invention.

EXAMPLE 2

Figure 4:
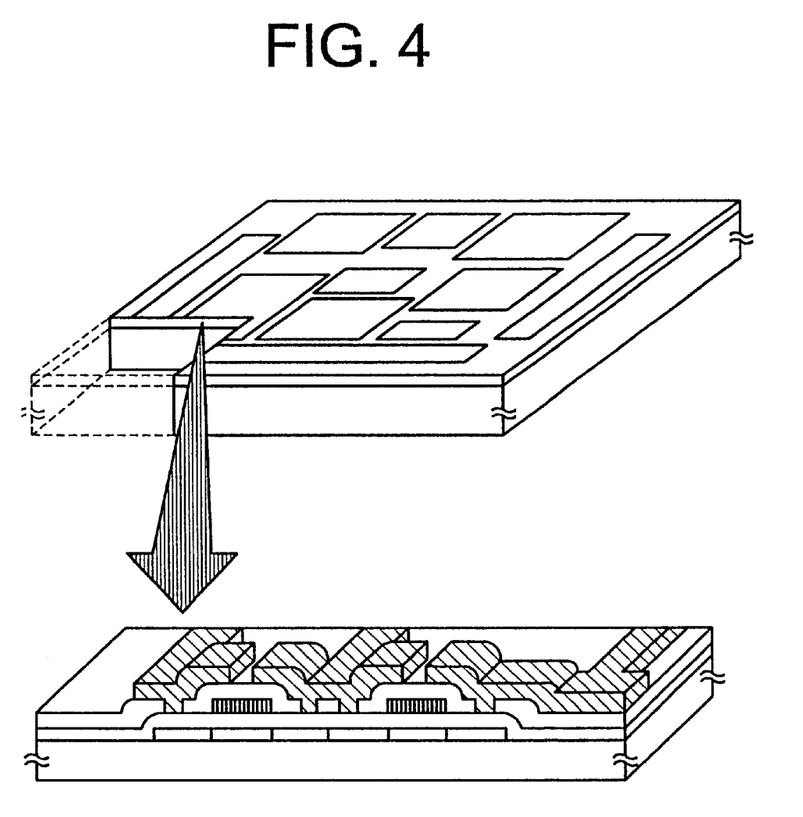
FIG. 4 is a graphical view showing an example of an integrated circuit comprising TFT.

Herein shown are examples of various devices comprising TFT. In FIG. 4, shown is an example of an integrated circuit comprising TFT.

As examples of integrated circuits, mentioned are CPU, memories, arithmetic circuits, amplifier circuits, switching circuits, etc.

The thin film transistor of the invention disclosed herein is usable in various flat panel displays, and also information-processing terminals, video cameras and others equipped with flat panel displays. All those devices are generically referred to as semiconductor devices herein.

Examples of concrete structures of various devices are mentioned below. FIG. 3A to FIG. 3F show examples of various semiconductor devices. These semiconductor devices each comprise TFT in at least some part thereof.

Figure 3A:
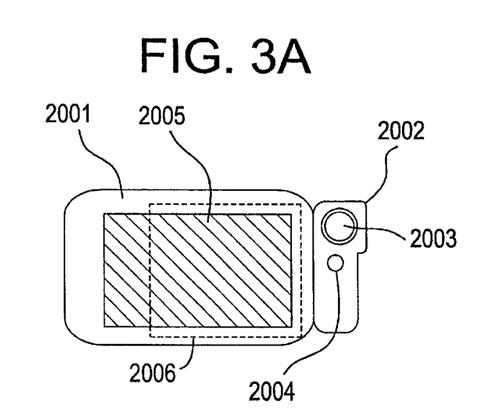
FIG. 3A to FIG. 3F are graphical views showing examples of devices comprising TFT.

FIG. 3A is a portable, information-processing terminal. The body 2001 of this information-processing terminal is provided with an active-matrix type, liquid crystal display or an active matrix-type, EL display 2005, and with a camera member 2002 through which it takes external information.

The camera member 2002 is provided with an image-receiving part 2003 and a control switch 2004.

It is expected that information-processing terminals will be thinner and more lightweight for enhancing their portability.

In the illustrated constitution, it is desirable that the peripheral drive circuit, arithmetic circuit and memory circuit to be on the substrate on which the active-matrix type display 2005 is formed are integrated with TFT. In FIG. 3A, 2006 is an integrated circuit.

Figure 3B:
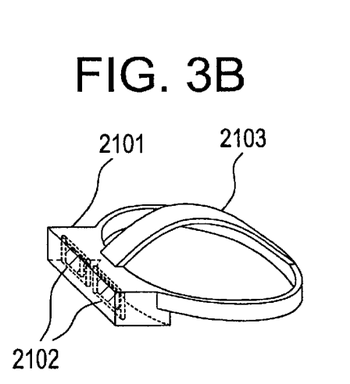

FIG. 3B is a head-mount display. Its body 2101 is provided with an active-matrix type, liquid crystal display or EL display 2102. The body 2101 can be mounted on the head with the band 2103.

Figure 3C:
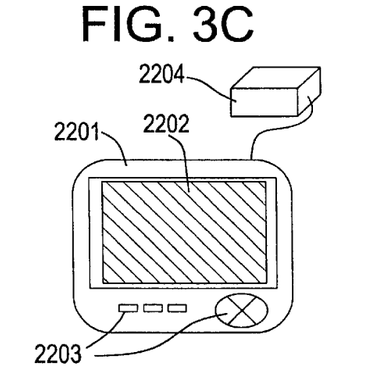

FIG. 3C is a car navigation system. Its body 2201 is provided with an active-matrix type, liquid crystal display device 2202, a control switch 2203 and an antenna 2204. In this system, the antenna 2204 receives signals from a satellite, and on the basis of the thus-received signals, the necessary geographic information is displayed on the display 2202.

For the display 2202, an EL-type display device may be employed. In any case, the display shall be an active-matrix type, flat panel display comprising TFT.

The control switch 2203 is to control the body 2201.

Figure 3D:
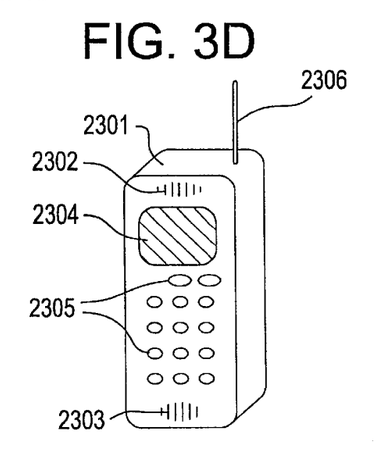

FIG. 3(D) is a portable telephone. Its body 2301 is provided with an active-matrix type, liquid crystal display device 2304, a control switch 2305, a voice-inputting member 2303, a voice-outputting member 2302 and an antenna 2306.

Recently, a combination composed of the portable, information-processing terminal of FIG. 3A and the portable telephone of FIG. 3D has been commercialized.

Figure 3E:
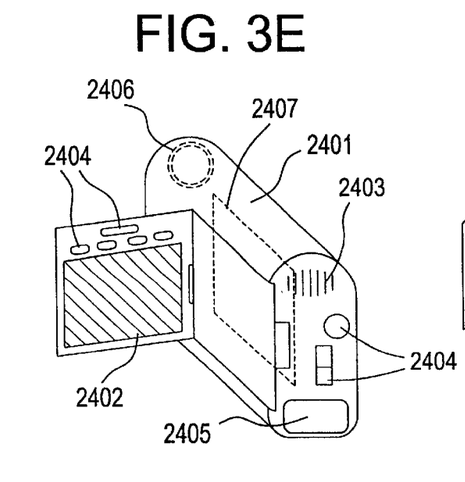

FIG. 3E is a portable video camera. Its body 2401 is provided with an image-receiving member 2406, a voice-inputting member 2403, a control switch 2404, an active-matrix type, liquid crystal display 2402, a battery 2405, and an integrated circuit 2407.

Figure 3F:
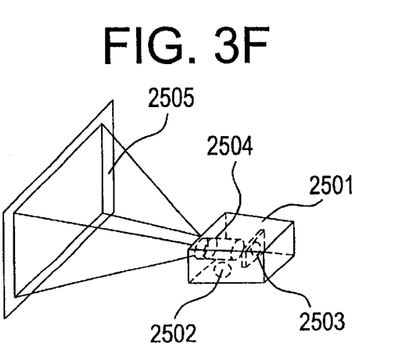

FIG. 3F is a front-projection-type, liquid crystal display device. Its body 2501 is provided with a light source 2502, a reflection-type, liquid crystal display device 2503, and an optical system 2504. This projection device has a function of displaying images on a screen 2505 positioned outside the device.

The liquid crystal display device to be used in the examples illustrated herein may be any of transmission-type ones or reflection-type ones.

The liquid crystal display device 2503 illustrated is a reflection-type one. In this, however, a transmission-type, liquid crystal display device can be used in place of the reflection-type one. For this, the optical system may be modified.

EXAMPLE 3

This Example is to demonstrate modifications of other Examples. In this is used a film of $Si_xGe_{1-x}$ (where $0.5<x<1$) is used in place of the silicon film.

In the invention disclosed herein, not only a silicon film of silicon alone but also a compound film consisting essentially of silicon can be processed. For the case of the latter compound film, the constitution of Example 1 is so modified that the amorphous silicon film is replaced with an amorphous film consisting essentially of silicon.

The film consisting essentially of silicon as referred to herein indicate a film that contains silicon in an amount of at least 50% or more.

For example, in the case of Example 1, the amorphous silicon film 102 may be replaced with an amorphous film of $Si_xGe_{1-x}$ (where $0.5<x<1$).

As has been described in detail herein, the present invention provides TFT of which the active layers are formed from a crystalline silicon layer to be produced by the use of a metal element capable of promoting the crystallization of silicon, and is characterized in that it provides a technique of preventing the characteristics of the TFT from being adversely influenced by the metal element used.

While the invention has been described in detail and with reference to specific embodiments thereof, it will be apparent to one skilled in the art that various changes and modifications can be made therein without departing from the spirit and scope thereof.

What is claimed is:

1. A method of manufacturing a semiconductor device comprising:

forming an amorphous semiconductor film over a substrate;

providing a material in contact with said amorphous semiconductor film, said material containing a crystallization promoting material and a gettering material;

first heating said amorphous semiconductor film and said material to crystallize said semiconductor film; and second heating said semiconductor film and said material thereby gettering said crystallization promoting material in a crystallized semiconductor film.

2. The method according to claim 1 wherein said first heating is performed between 500 and 750° C., and said second heating is performed between 800 and 1100° C.

3. The method according to claim 1 wherein said crystallization promoting material is one selected from the group consisting of Ni, Fe, Co, Ru, Rh, Pd, Os, Ir, Pt, Cu, Au, Ge, and In.

4. The method according to claim 1 wherein said gettering material is one selected from the group consisting of phosphorus, arsenic, and antimony.

5. The method according to claim 1 wherein said amorphous semiconductor film comprises $Si_xGe_{(1-x)}$ ($0.5<x<1$).

6. The method according to claim 1 wherein said semiconductor device is an EL display device.

7. The method according to claim 1 wherein said semiconductor device is one selected from the group consisting of a portable information-processing terminal, a head-mount display, a car navigation system, a portable telephone, a video camera, and a projector.

8. The method according to claim 1 wherein said semiconductor device is an integrated circuit including at least one selected from the group consisting of a CPU, a memory, an arithmetic circuit, an amplifier circuit, and a switching circuit.

9. A method of manufacturing a semiconductor device comprising:

forming an amorphous semiconductor film over a substrate;

crystallizing said amorphous semiconductor film by diffusing a crystallization promoting material selectively provided on said amorphous semiconductor film; and reducing a concentration of said crystallization promoting material by a gettering material selectively diffused into a crystallized semiconductor film, wherein said crystallization promoting material and said gettering material are diffused from a same portion of said semiconductor film.

10. The method according to claim 9 wherein said crystallizing step is performed between 500 and 750° C., and said reducing step is performed between 800 and 1100° C.

11. The method according to claim 9 wherein said crystallization promoting material is one selected from the group consisting of Ni, Fe, Co, Ru, Rh, Pd, Os, fr, Pt, Cu, Au, Ge, and In.

12. The method according to claim 9 wherein said gettering material is one selected from the group consisting of phosphorus, arsenic, and antimony.

13. The method according to claim 9 wherein said amorphous semiconductor film comprises $Si_xGe_{(1-x)}$ (0.5<x<1).

14. The method according to claim 9 wherein said semiconductor device is an EL display device.

15. The method according to claim 9 wherein said semiconductor device is one selected from the group consisting of a portable information-processing terminal, a head-mount display, a car navigation system, a portable telephone, a video camera, and a projector.

16. The method according to claim 9 wherein said semiconductor device is an integrated circuit including at least one selected from the group consisting of a CPU, a memory, an arithmetic circuit, an amplifier circuit, and a switching circuit.

17. A method of manufacturing a semiconductor device comprising:

forming an amorphous semiconductor film over a substrate;

providing a material in contact with a selected portion of said amorphous semiconductor film, said material containing a crystallization promoting material and a gettering material;

first heating said amorphous semiconductor film and said material to crystallize said semiconductor film; and second heating said semiconductor film and said material thereby gettering said crystallization promoting material in a crystallized semiconductor film.

18. The method according to claim 17 wherein said first heating is performed between 500 and 750° C., and said second heating is performed between 800 and 1100° C.

19. The method according to claim 17 wherein said crystallization promoting material is one selected from the group consisting of Ni, Fe, Co, Ru, Rh, Pd, Os, Ir, Pt, Cu, Au, Ge, and In.

20. The method according to claim 17 wherein said gettering material is one selected from the group consisting of phosphorus, arsenic, and antimony.

21. The method according to claim 17 wherein said amorphous semiconductor film comprises $Si_xGe_{(1-x)}$ (0.5<x<1).

22. The method according to claim 17 wherein said semiconductor device is an EL display device.

23. The method according to claim 17 wherein said semiconductor device is one selected from the group consisting of a portable information-processing terminal, a head-mount display, a car navigation system, a portable telephone, a video camera, and a projector.

24. The method according to claim 17 wherein said semiconductor device is an integrated circuit including at least one selected from the group consisting of a CPU, a memory, an arithmetic circuit, an amplifier circuit, and a switching circuit.

25. A method of manufacturing a semiconductor device comprising:

forming an amorphous semiconductor film over a substrate;

crystallizing said amorphous semiconductor film by diffusing a crystallization promoting material selectively provided on said amorphous semiconductor film;

reducing a concentration of said crystallization promoting material by a gettering material selectively diffused into a crystallized semiconductor film; and patterning said crystallized semiconductor film into a plurality of active layers, wherein said crystallization promoting material and said gettering material are diffused from a same portion of said semiconductor film.

26. The method according to claim 25 wherein said crystallizing step is performed between 500 and 750° C., and said reducing step is performed between 800 and 1100° C.

27. The method according to claim 25 wherein said crystallization promoting material is one selected from the group consisting of Ni, Fe, Co, Ru, Rh, Pd, Os, Ir, Pt, Cu, Au, Ge, and In.

28. The method according to claim 25 wherein said gettering material is one selected from the group consisting of phosphorus, arsenic, and antimony.

29. The method according to claim 25 wherein said amorphous semiconductor film comprises $Si_xGe_{(1-x)}$ (0.5<x<1).

30. The method according to claim 25 wherein said semiconductor device is an EL display device.

31. The method according to claim 25 wherein said semiconductor device is one selected from the group consisting of a portable information-processing terminal, a head-mount display, a car navigation system, a portable telephone, a video camera, and a projector.

32. The method according to claim 25 wherein said semiconductor device is an integrated circuit including at least one selected from the group consisting of a CPU, a memory, an arithmetic circuit, an amplifier circuit, and a switching circuit.

33. A method of manufacturing a semiconductor device comprising:

forming an amorphous semiconductor film over a substrate;

providing a material in contact with said amorphous semiconductor film, said material containing a crystallization promoting material and a gettering material;

first heating said amorphous semiconductor film and said material to crystallize said semiconductor film;

second heating said semiconductor film and said material thereby gettering said crystallization promoting material in a crystallized semiconductor film; and patterning said crystallized semiconductor film into a plurality of active layers.

34. The method according to claim 33 wherein said first heating is performed between 500 and 750° C., and said second heating is performed between 800 and 1100° C.

35. The method according to claim 33 wherein said crystallization promoting material is one selected from the group consisting of Ni, Fe, Co, Ru, Rh, Pd, Os, Ir, Pt, Cu, Au, Ge, and In.

36. The method according to claim 33 wherein said gettering material is one selected from the group consisting of phosphorus, arsenic, and antimony.

37. The method according to claim 33 wherein said amorphous semiconductor film comprises $Si_xGe_{(1-x)}$ (0.5<x<1).

38. The method according to claim 33 wherein said semiconductor device is an EL display device.

39. The method according to claim 33 wherein said semiconductor device is one selected from the group consisting of a portable information-processing terminal, a head-mount display, a car navigation system, a portable telephone, a video camera, and a projector.

40. The method according to claim 33 wherein said semiconductor device is an integrated circuit including at least one selected from the group consisting of a CPU, a memory, an arithmetic circuit, an amplifier circuit, and a switching circuit.

* * * * *